United States Patent
Liu et al.

(10) Patent No.: US 9,471,489 B2
(45) Date of Patent: Oct. 18, 2016

(54) CACHING METHOD AND DATA STORAGE SYSTEM CAPABLE OF PROLONGING SERVICE LIFETIME OF A CACHE MEMORY

(71) Applicant: NATIONAL TAIWAN UNIVERSITY, Taipei (TW)

(72) Inventors: Ren-Shuo Liu, Taipei (TW); Chia-Lin Yang, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 433 days.

(21) Appl. No.: 14/229,509

(22) Filed: Mar. 28, 2014

(65) Prior Publication Data
US 2015/0280742 A1 Oct. 1, 2015

(51) Int. Cl.
| | |
|---|---|
| H03M 13/11 | (2006.01) |
| H03M 13/00 | (2006.01) |
| G06F 12/08 | (2016.01) |
| H03M 13/09 | (2006.01) |
| H03M 13/15 | (2006.01) |
| H03M 13/35 | (2006.01) |
| G06F 11/00 | (2006.01) |

(52) U.S. Cl.
CPC ........... *G06F 12/0802* (2013.01); *G06F 11/00* (2013.01); *G06F 12/0893* (2013.01); *H03M 13/09* (2013.01); *H03M 13/1102* (2013.01); *H03M 13/152* (2013.01); *H03M 13/353* (2013.01); *G06F 2212/1032* (2013.01)

(58) Field of Classification Search
None
See application file for complete search history.

(56) References Cited

U.S. PATENT DOCUMENTS

| | | | | |
|---|---|---|---|---|
| 7,975,095 | B2 * | 7/2011 | Hsieh | G06F 12/0866 365/185.33 |
| 9,104,599 | B2 * | 8/2015 | Atkisson | G06F 11/108 |
| 9,256,526 | B2 * | 2/2016 | Liu | G06F 12/0246 |
| 2013/0205097 | A1 * | 8/2013 | Flynn | G06F 12/0246 711/142 |
| 2014/0208005 | A1 * | 7/2014 | Simionescu | G06F 12/0804 711/103 |
| 2015/0010143 | A1 * | 1/2015 | Yang | G09C 1/00 380/28 |
| 2015/0199269 | A1 * | 7/2015 | Bert | G06F 12/0246 711/103 |
| 2015/0280742 | A1 * | 10/2015 | Liu | G06F 12/0802 714/758 |
| 2015/0324294 | A1 * | 11/2015 | Ogawa | G06F 12/0871 711/118 |

* cited by examiner

*Primary Examiner* — Justin R Knapp
(74) *Attorney, Agent, or Firm* — Birch, Stewart, Kolasch & Birch, LLP

(57) ABSTRACT

In a caching method implemented by a data storage system, a data word as user data is encoded into a codeword that is then written into an area of a cache memory. The codeword includes a data portion, a checksum parity portion and an error correction code (ECC) parity portion. In response to a read request for the user data, the codeword read from the cache memory is decoded based on the ECC parity portion to correct one or more bit errors within the data portion so as to generate a read data portion and a read checksum parity portion. Upon identifying that a validating checksum portion generated based on the read data portion matches the read checksum parity portion, the read data portion serving as the user data is outputted. Otherwise, a data storage unit outputs the user data previously stored therein.

20 Claims, 6 Drawing Sheets

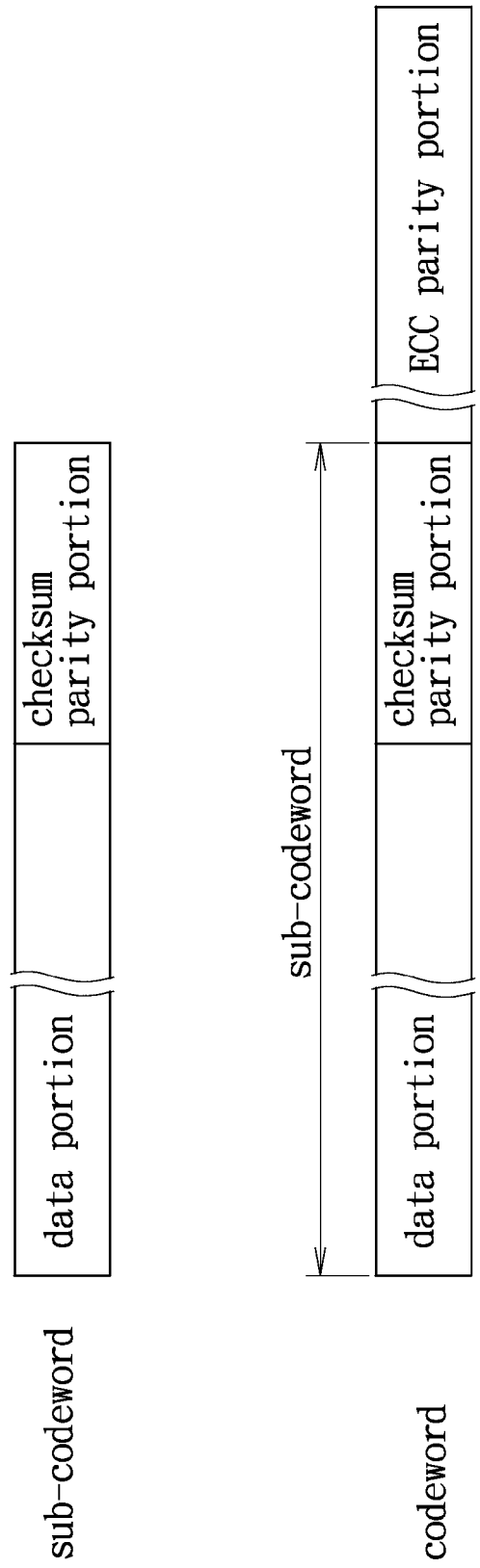
F I G. 5

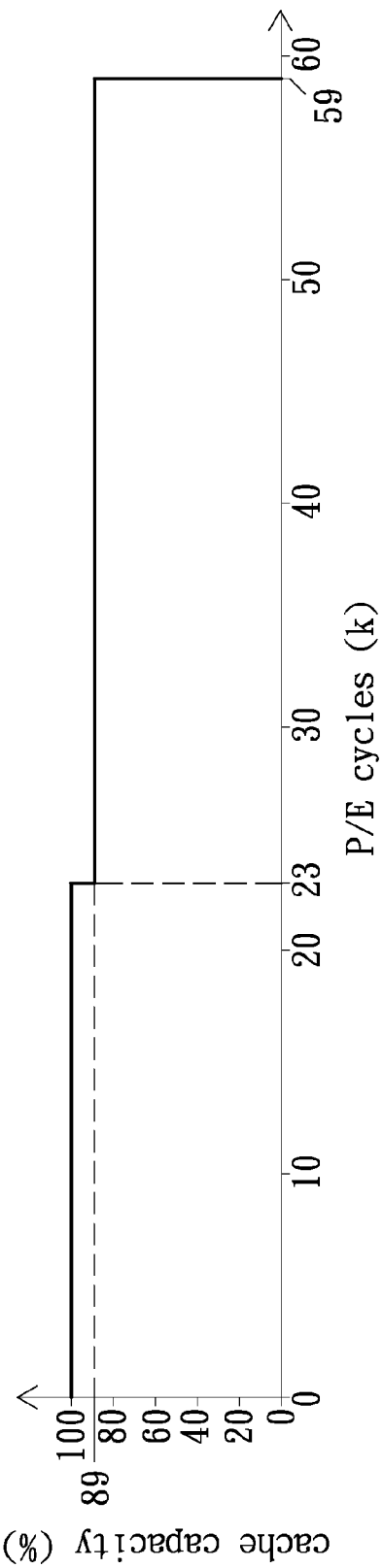
F I G. 7

CACHING METHOD AND DATA STORAGE SYSTEM CAPABLE OF PROLONGING SERVICE LIFETIME OF A CACHE MEMORY

BACKGROUND OF THE INVENTION

1. Field of the Invention

The invention relates to a caching method and a data storage system, and more particularly to a caching method and a data storage system capable of prolonging service lifetime of a cache memory.

2. Description of the Related Art

Currently, adopting solid state drives (SSDs) as caches for hard disk drive (HDD) arrays has gained popularity in datacenters because SSDs are superior in handling small and random reads that HDDs may not efficiently deal with. It has been widely accepted that utilizing NAND flash based SSDs as caches is a cost-effective approach for optimizing storage performance. However, modern 25-nm two-bit multi-level cell (MLC) NAND flashes usually have a limited endurance of about 3000 program/erase (P/E) cycles, which is too low to sustain on-line transaction processing (OLTP) workloads, such as Transaction Processing Performance Council-C (TPC-C) workloads. TPC-C can cause an SSD cache to be programmed and erased 39 cycles per day on average. That means, the service lifetime of SSD caches using such MLC NAND flashes is as short as about 77

$$\left(\frac{3000}{39} \approx 77\right)$$

days. Therefore, to enable the adoption of MLC NAND flashes in SSD caches, it is critical to resolve the endurance issue.

The following are several conventional techniques proposed to improve the service lifetime of a flash-based memory given limited endurance:

1. Wear leveling aims at evenly spreading writes to the entire flash memory to prevent early wearout of blocks of the cache memory due to concentrated writes. Although wear leveling can ensure a reasonable service lifetime for flash devices with moderate write intensiveness, such as memory cards, USB drives and SSDs in personal computers (PCs), it is less effective on sustaining a long enough service lifetime for SSD caches given the high P/E rate of datacenter workloads.

2. A technique exploiting the property that if retention requirement for flash memory is lowered, errors due to leakage over time are reduced, named Retention Relaxation, is well suited to SSD caches in datacenters. Since datacenters operate continuously, data in SSD caches can be periodically refreshed to reduce their retention requirement. In addition, since a datacenter workload can program and erase SSD caches for up to 39 cycles per day, the data lifetime in SSD caches is expected to be shorter than a day.

3. Error correction code (ECC) strength is increased under a constant-rate constraint, which means that the ratio between data bits and parity bits of an ECC codeword has to be kept constant. For example, Dynamic Codeword Transition (DCT) is used to enlarge ECC codewords for strengthening ECCs. With increased ECC strength, flash devices can have higher endurance. FIG. 1 illustrates exemplary compositions of a common codeword ($C_{common}$) and a DCT codeword ($C_{DCT}$) having the same data-to-parity ratio. The common codeword ($C_{common}$) has k data bits and r ECC parity bits. To increase ECC strength, the size of the DCT codeword ($C_{DCT}$) is enlarged to $\alpha$ times that of the common codeword ($C_{common}$) without changing the ratio between the data bits and the parity bits. That is, the DCT codeword ($C_{DCT}$) has $\alpha k$ data bits and $\alpha r$ ECC parity bits.

FIG. 2 shows an experimental result that illustrates the relationships between available cache capacity and achievable P/E cycles of a tested cache memory for different scenarios using the above conventional techniques. In this experiment, the tested cache memory is a modern 25-nm two-bit MLC NAND flash memory, and all the scenarios support wear leveling and basic ECC strength (24-bit error correction per 1080 bytes). The first scenario achieves 3 k P/E cycles, as indicated by the curve (P1) in FIG. 2. The second scenario further adopts Retention Relaxation, and achieves 14 k P/E cycles, as indicated by the curve (P2) in FIG. 2. The third scenario further adopts DTC ($\alpha$=4), and achieves 21 k P/E cycles, as indicated by the curve (P3) in FIG. 2.

However, improvements may still be made to the above techniques.

SUMMARY OF THE INVENTION

Therefore, an object of the present invention is to provide a caching method and a data storage system that can enable a cache memory to have a relatively long service lifetime.

According to one aspect of the present invention, there is provided a caching method to be implemented by a data storage system. The data storage system includes a data storage unit, a cache memory, and a processing unit coupled to the data storage unit and the cache memory. The processing unit is configured with a write count, a read count and a validation-failure count that are associated with the cache memory. The caching method of the present invention comprises the following steps:

a) upon receipt of a data word to be written into the cache memory, the processing unit encoding, based on a code rate, the data word into a codeword, which includes a data portion corresponding to the data word, a checksum parity portion associated with a target bit error rate (BER), and an error correction code (ECC) parity portion, writing the codeword into an area of the cache memory, and writing the data word into the data storage unit in response to detecting a first condition associated with the area of the cache memory; and b) upon receipt of a read request for the data word, the processing unit reading the codeword corresponding to the data word from the cache memory based on the read request, decoding the read codeword to correct one or more bit errors within the read codeword based on the ECC parity portion thereof so as to generate a sub-codeword that includes a read data portion and a read checksum parity portion, validating whether the read data portion is free of any bit error, upon successful validation, outputting the read data portion as the data word, and upon unsuccessful validation, reading the data word from the data storage unit and outputting the data word thus read from the data storage unit.

According to another aspect of the present invention, a data storage system comprises a data storage unit, a cache memory and a processing unit.

The processing unit includes a control module coupled to the data storage unit, a checksum encoder coupled to the control module, an error correction code (ECC) encoder coupled to the checksum encoder, a checksum validation unit coupled to the control module, an ECC decoder coupled to the checksum validation unit, and an access unit coupled to the ECC encoder, the ECC decoder, the cache memory and the control module.

Upon receipt of a data word by the control module, the control module transmits the data word to the checksum encoder. The checksum encoder is operable to encode the data word transmitted from the control module into a sub-codeword, which includes a data portion corresponding to the data word, and a checksum parity portion associated with a target bit error rate (BER), and to transmit the sub-codeword to the ECC encoder. The ECC encoder is operable to encode, based on a code rate, the sub-codeword transmitted from the checksum encoder into a codeword, which includes the sub-codeword and an ECC parity portion, and to transmit the codeword to the access unit. The access unit writes the codeword transmitted from the ECC encoder into an area of the cache memory. The access unit further writes the data word into the data storage unit in response to detecting a first condition associated with the area of the cache memory.

Upon receipt of a read request for the data word by the control module, the control module generates an access control signal based on the read request, and transmits the access control signal to the access unit. The access unit reads the codeword corresponding to the data word from the cache memory based on the access control signal transmitted from the control module, and transmits the read codeword to the ECC decoder. The ECC decoder is operable to decode the read codeword transmitted from the access unit to correct one or more bit errors within the read codeword based on the ECC parity portion thereof so as to generate a read sub-codeword, which includes a read data portion and a read checksum parity portion, and to transmit the read sub-codeword to the checksum validation unit. The checksum validation unit is operable to validate whether the read sub-codeword transmitted from the ECC decoder is free of any bit error so as to generate a validation result, and to transmit the read data portion of the read sub-codeword and the validation result to the control module. When the validation result indicates successful validation, the control module outputs the read data portion as the data word. When the validation result indicates unsuccessful validation, the control module reads the data word from the data storage unit and outputs the data word.

BRIEF DESCRIPTION OF THE DRAWINGS

Other features and advantages of the present invention will become apparent in the following detailed description of the preferred embodiment with reference to the accompanying drawings, of which:

FIG. 5 is a schematic view illustrating a sub-codeword and a codeword generated by the preferred embodiment;

FIG. 7 is a plot of an experimental result that illustrates the relationship between available cache capacity and achievable P/E cycles of a cache memory of the preferred embodiment.

DETAILED DESCRIPTION OF THE PREFERRED EMBODIMENT

Figure 1:
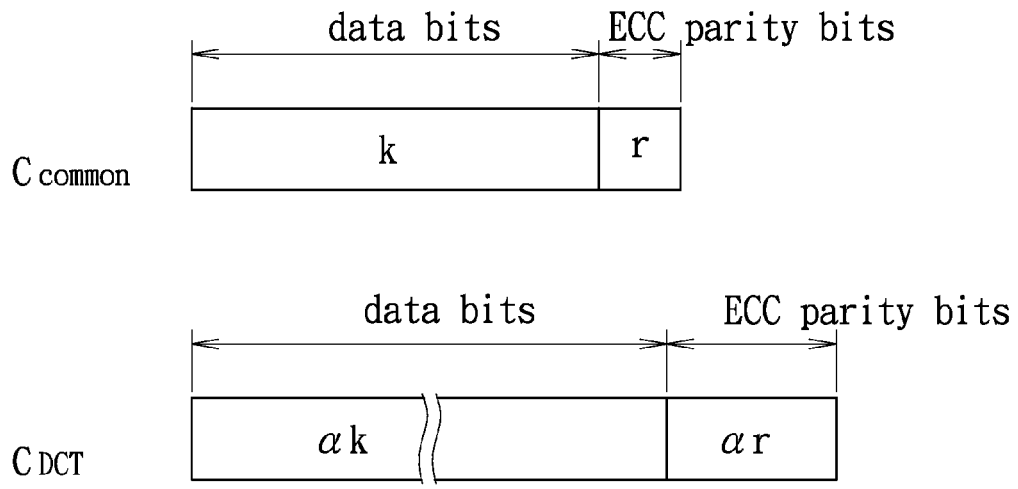
FIG. 1 is a schematic view illustrating different codeword compositions.
Figure 2:
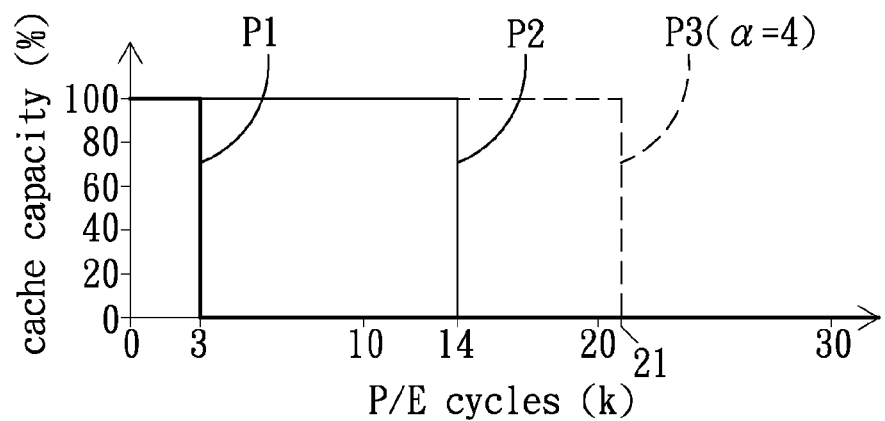
FIG. 2 is a plot of an experimental result that illustrates the relationships between available cache capacity and achievable program/erase (P/E) cycles of a tested cache memory for different scenarios using conventional techniques.
Figure 3:
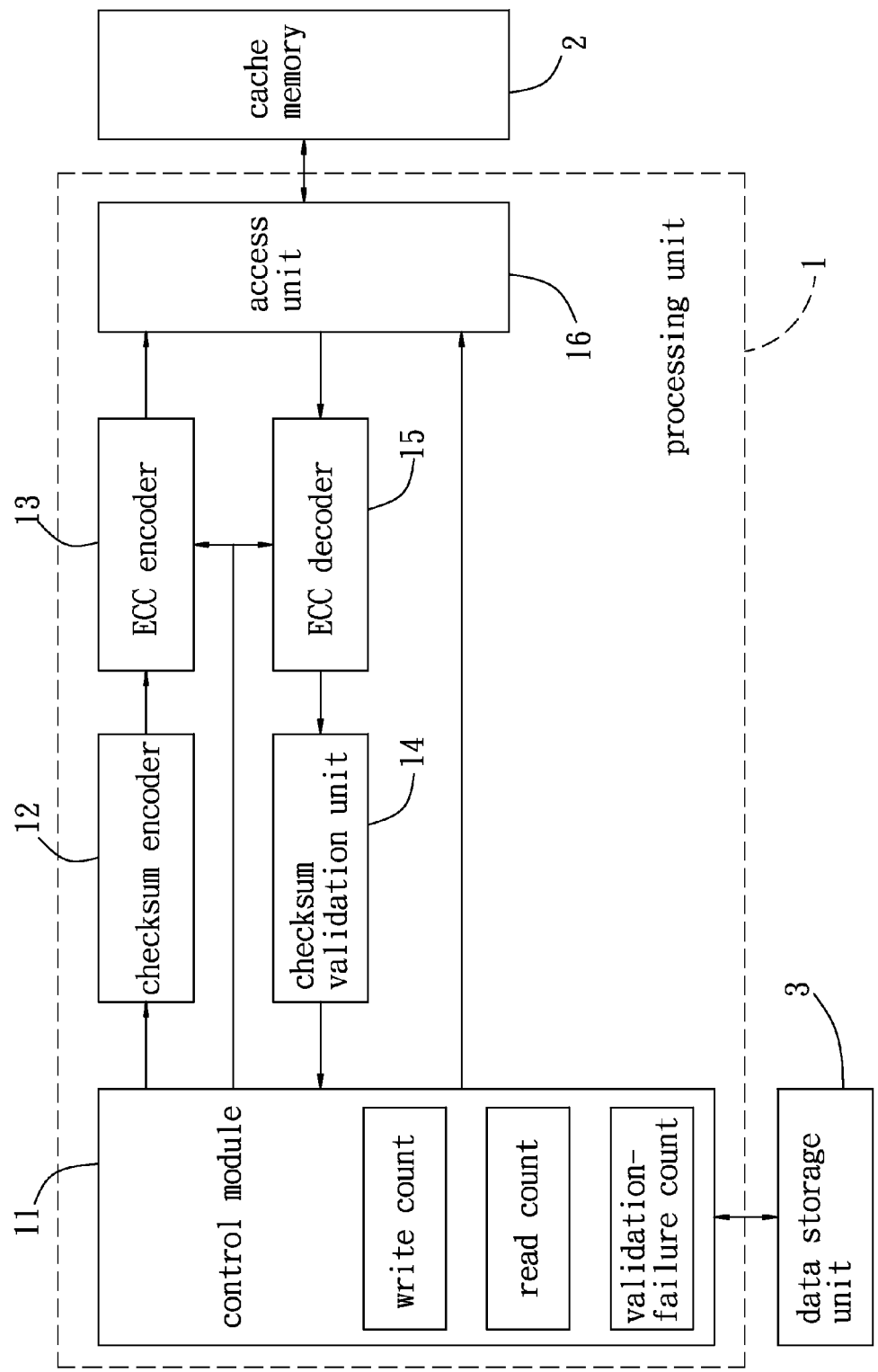
FIG. 3 is a schematic block diagram illustrating the preferred embodiment of a data storage system according to the present invention.

Referring to FIG. 3, the preferred embodiment of a data storage system according to the present invention is shown to include a cache memory 2, such as a NAND flash memory, a data storage unit 3, such as a hard disk drive (HDD), and a processing unit 1.

The processing unit 1 includes a control module 11 coupled to the data storage unit 3, a checksum encoder 12 coupled to the control module 11, an error correction code (ECC) encoder 13 coupled to the checksum encoder 12 and the control module 11, a checksum validation unit 14 coupled to the control module 11, an ECC decoder 15 coupled to the checksum validation unit 14 and the control module 11, and an access unit 16 coupled to the ECC encoder 13, the ECC decoder 15, the cache memory 2 and the control module 11. The control module 11 is configured with a write count, a read count and a validation-failure count that are associated with an area of the cache memory 2. The write count corresponds to the number of program/erase cycles of the area of the cache memory 2. In this embodiment, the checksum encoder 12 is a cyclic redundancy check (CRC) encoder. The ECC encoder 13 is a Bose Chaudhuri Hocquenghem (BCH) code encoder while the ECC decoder 15 is a BCH code decoder. Alternatively, the ECC encoder 13 may be a Low-Density Parity-Check (LDPC) code encoder and the ECC decoder 15 may be an LDPC code decoder, respectively.

Figure 4:
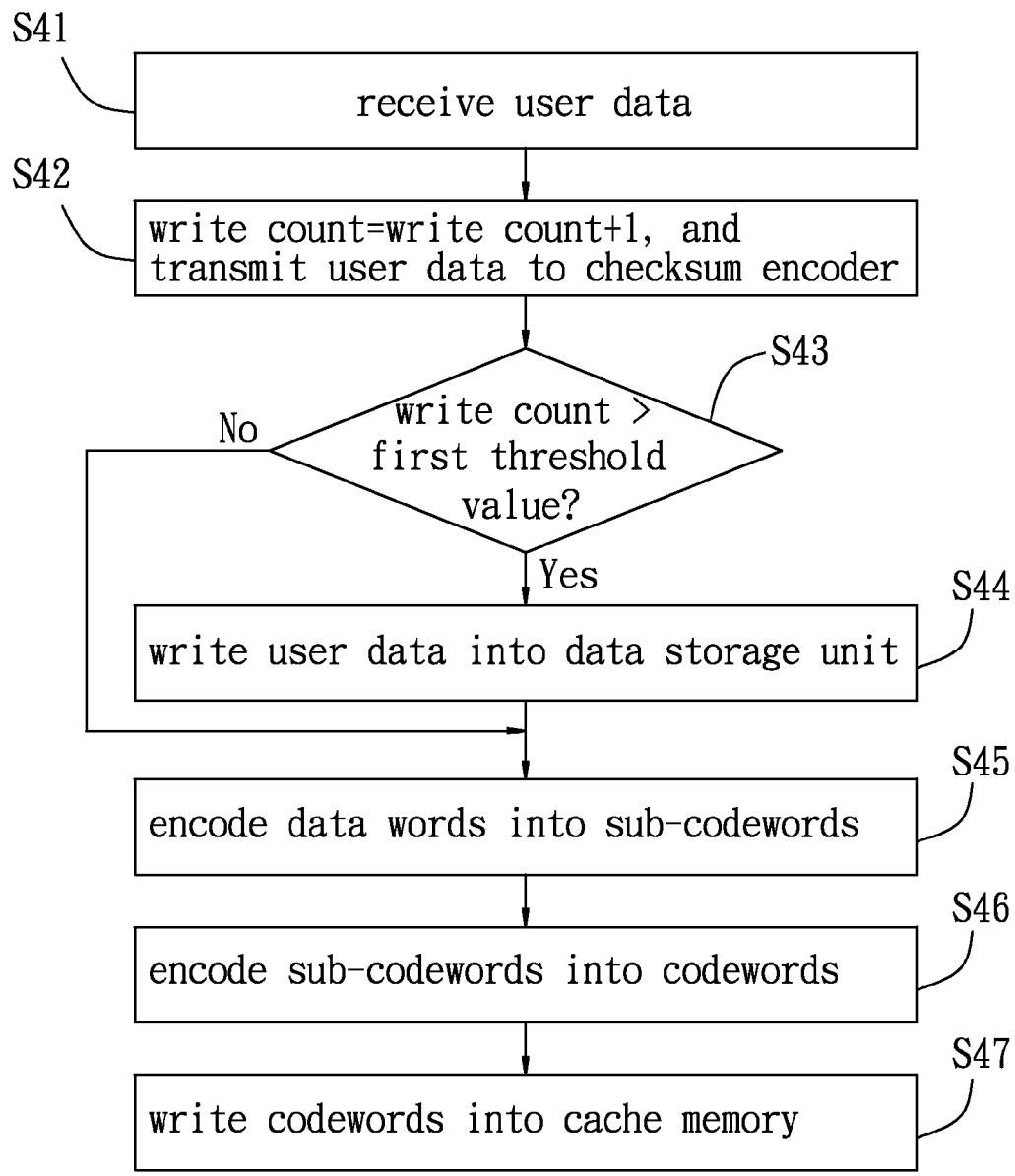
FIG. 4 is a flow chart illustrating how a processing unit of the preferred embodiment performs a write operation of user data.

FIG. 4 is a flow chart illustrating how the processing unit 1 performs a write operation of user data. The user data is to be written into the area of the cache memory 2, and is in the form of a binary data stream of one or more data words. In this embodiment, the user data is included in an external write request transmitted to the processing unit 1. It is noted that, in other embodiments, the user data may have been pre-stored in the data storage unit 3, and is then transmitted from the data storage unit 3 to the processing unit 1.

Upon receipt of the write request, the control module 11 thus receives (or has thus received) the user data (step S41). Then, the control module 11 updates the write count by adding one to the write count, and transmits the data words (i.e., the user data) to the checksum encoder 12 (step S42). Thereafter, the control module 11 determines whether the updated write count exceeds a predetermined first threshold value (step S43), wherein the updated write count exceeding the predetermined first threshold value is regarded as a first condition associated with the area of the cache memory 2. If the result is affirmative, the flow proceeds to step S44. Otherwise, the flow goes to step S45. In this embodiment, if the cache memory 2 is a multi-level cell (MLC) NAND flash memory, preferably, the predetermined first threshold value may not be greater than 3000, which is associated with the endurance of the MLC NAND flash memory, i.e., 3000 program/erase (P/E) cycles. In this embodiment, the predetermined first threshold value is 3000.

In step S44, the control module 11 writes the user data into the data storage unit 3.

In step S45, upon receipt of the data words from the control module 11, the checksum encoder 12 encodes, based on a code rate, each data word into a respective sub-codeword, which includes a data portion corresponding to the data word, and a checksum parity portion associated with a target bit error rate (BER), as shown in FIG. 5. It is noted that the code rate for encoding each data word is defined as the ratio of the bit length of the sub-codeword to the bit length of a codeword corresponding to the data word. Then, the checksum encoder 12 transmits to the ECC encoder 13 the sub-codewords corresponding respectively to the data words. In this embodiment, the checksum parity portion of each sub-codeword is a CRC code and has a bit length determined based on the target BER. To conform to industrial BER requirements for data read from the data storage system, the target BER is preferably not greater than $10^{-16}$. Table 1 exemplarily illustrates the relationship between the target BER and the bit length of the checksum parity portion.

TABLE 1

| Target BER | Bit length of checksum parity portion (bits) |
|---|---|
| $10^{-20}$ | 67 |
| $10^{-19}$ | 64 |
| $10^{-18}$ | 60 |
| $10^{-17}$ | 57 |
| $10^{-16}$ | 54 |

In step S46, upon receipt of the sub-codewords from the checksum encoder 12, the ECC encoder 13 encodes each sub-codeword into a respective codeword, which includes the sub-codeword and an ECC parity portion having an adjustable bit length, as shown in FIG. 5. Then, the ECC encoder 13 transmits to the access unit 16 the codewords corresponding respectively to the sub-codewords. In this embodiment, the ECC parity portion is, for example, a BCH code. Alternatively, the ECC parity portion is in the form of a Low-Density Parity-Check (LDPC) code.

In step S47, upon receipt of the codewords from the ECC encoder 13, the access unit 16 writes the codewords into the area of the cache memory 2.

Figure 6:
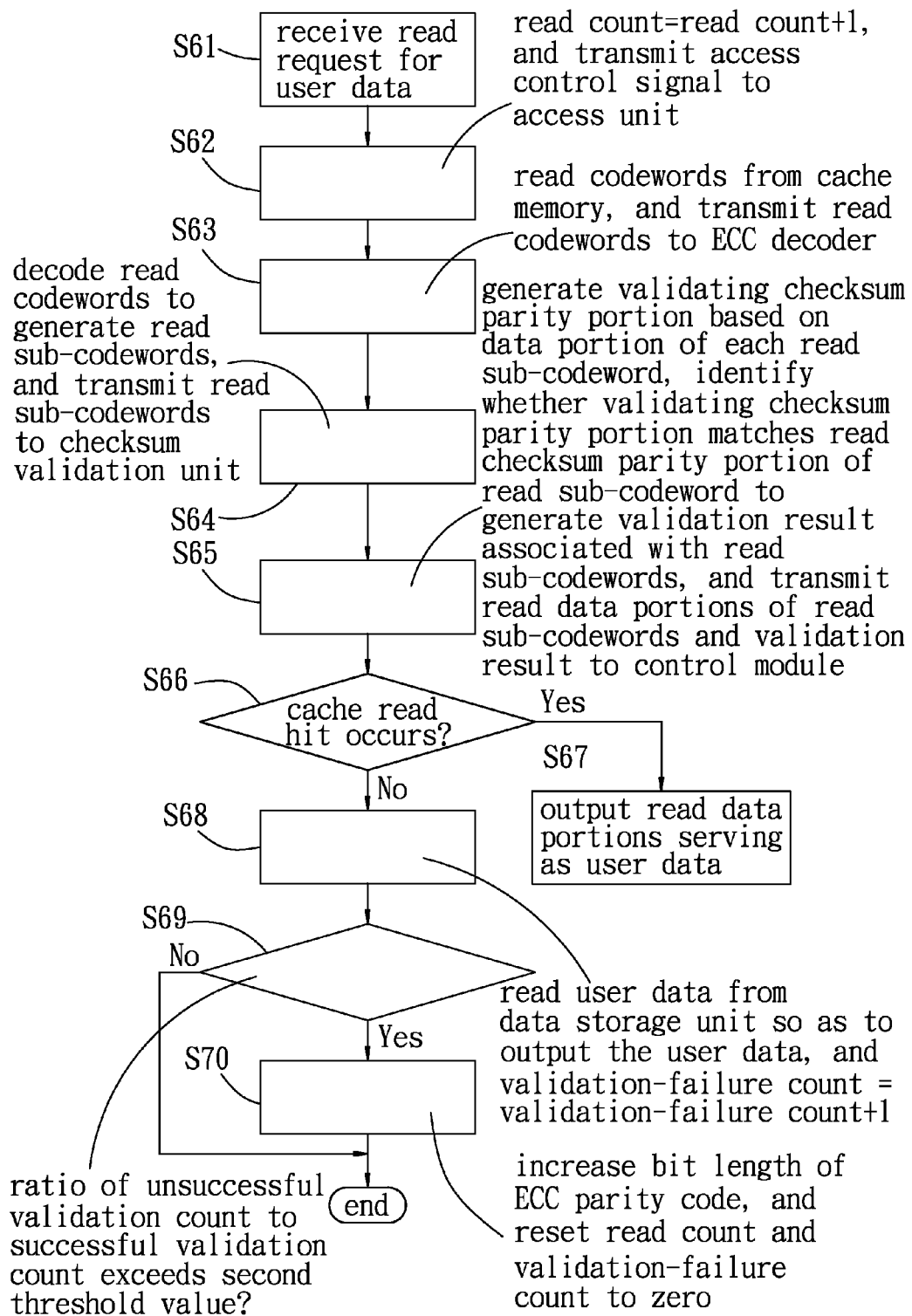
FIG. 6 is a flow chart illustrating how the processing unit of the preferred embodiment performs a read operation of the user data.

FIG. 6 is a flow chart illustrating how the processing unit 1 performs a read operation of the user data. When the control module 11 receives a read request for the user data (step S61), the control module 11 updates the read count by adding one to the read count, generates an access control signal based on the read request, and transmits the access control signal to the access unit 16 (step S62). Then, upon receipt of the access control signal from the control module 11, the access unit 16 reads the codewords corresponding to the user data from the cache memory 2 based on the access control signal, and transmits the read codewords to the ECC decoder 15 (step S63).

In step S64, upon receipt of the read codewords from the access unit 16, the ECC decoder 15 decodes each read codeword based on the ECC parity portion of the read codeword to correct one or more bit errors within the sub-codeword of the read codeword, thereby generating a plurality of read sub-codewords, each of which corresponds to a respective one of the read codewords and includes a read data portion and a read checksum parity portion. Then, the ECC decoder 15 transmits the read sub-codewords generated thereby to the checksum validation unit 14.

In step S65, upon receipt of the read sub-codewords from the ECC decoder 15, the checksum validation unit 14 encodes the read data portion of each read sub-codeword in the same checksum encoding manner as used in the checksum encoder 12 to generate a validating checksum parity portion, and identify whether the validating checksum parity portion generated thereby matches the read checksum parity portion of the read sub-codeword, thereby generating a validation result associated with the read sub-codewords. Then, the checksum validation unit 14 transmits the read data portions of the read sub-codewords and the validation result to the control module 11.

In step S66, upon receipt of the read data portions of the read sub-codewords and the validation result from the checksum validation unit 14, the control module 11 determines, based on the validation result, whether a cache read hit occurs. When the validation result indicates successful validation of the validating checksum parity portion corresponding to each read sub-codeword, the read data portions of the read sub-codewords generated in step S64 are identical to the data portions generated in step S45, and this is called the cache read hit, and the flow then proceeds to step S67. When the validation result indicates unsuccessful validation of the validating checksum parity portion corresponding to at least one read sub-codeword, the read data portions of the read sub-codewords generated in step S64 are different from the data portions generated in step S45, i.e., there exists at least one bit error within the read data portions, and this is called a cache read miss, and the flow then goes to step S68.

In step S67, the control module 11 outputs the read data portions serving as the user data.

In step S68, the control module 11 reads the user data from the data storage unit 3 and outputs the user data thus read, and updates the validation-failure count by adding one to the validation-failure count.

In step S69, the control module 11 determines whether the ratio of an unsuccessful validation count (i.e., the validation-failure count) to a successful validation count (i.e., the read count minus the validation-failure count) exceeds a predetermined second threshold value, wherein the ratio of the unsuccessful validation count to the successful validation count exceeding the predetermined second threshold value is regarded as a second condition associated with the area of the cache memory 2. If the result is affirmative, the flow proceeds to step S70. Otherwise, the flow is terminated. In this embodiment, the predetermined second threshold value may not be greater than 0.01.

In step S70, the control module 11 generates and outputs a parity adjustment signal to the ECC encoder 13 and the ECC decoder 15. Therefore, the ECC encoder 13 increases the bit length of the ECC parity portion (i.e., decreases the code rate) for a next encoding operation in response to the parity adjustment signal from the control module 11, and the ECC decoder 15 performs a next decoding operation with reference to the parity adjustment signal. In addition, the control module 11 resets the read count and the validation-failure count to zero.

FIG. 7 is a plot of an experimental result that illustrates the relationship between available cache capacity and achievable P/E cycles of the cache memory 2. In this example, the cache memory 2 is a NADN flash memory whose specification is shown in Table 2 below. In addition, for each codeword having a 1080-byte size, the bit length of the checksum parity portion is 54 bits, and the bit length of the ECC parity portion is initially 42 bytes.

TABLE 2

| Technology | 25-nm, 2-bit per cell |
|---|---|
| Page size | 8640 bytes |
| Block size | 256 pages |
| ECC requirement | 24-bit error correction per 1080 bytes |
| Rated endurance | 3000 P/E cycles |

As seen in FIG. 7, initially, due to the use of the checksum parity portion of each codeword, the cache memory 2 can achieve about 23 k P/E cycles. It is noted that the cache read miss ratio may increase with the increase of the number of the P/E cycles. Thus, when the cache read miss ratio reaches 0.01, the bit length of the ECC parity portion of each codeword is increased to four times the initial size, i.e., 168 (42×4) bytes. As a result, the error correction capability becomes 96-bit error correction per 1080 bytes, but the available capacity of the cache memory 2 may be reduced by about 11%, which is used to store an added portion (i.e., 126 (42×3) bytes) of the ECC parity portion of each codeword. Nevertheless, after increasing the bit length of the ECC parity portion of each codeword, the cache memory 2 can achieve about 59 k P/E cycles. As mentioned earlier, write-intensive workloads, such as TPC-C, may cause SSD caches to be programmed and erased cycles per day. In this case, for such a write-intensive workload, the data storage system of the present invention can allow the cache memory 2 to continue operating for about 4.14

$$\left(\frac{59 \times 1000}{39 \times 365} \approx 4.14\right)$$

years by sacrificing a small storage capacity of the cache memory 2.

In view of the above, the data storage system of this invention can effectively enable the cache memory 2 to have a relatively long service lifetime as compared to the aforesaid conventional techniques.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A caching method to be implemented by a data storage system that includes a data storage unit, a cache memory, and a processing unit coupled to the data storage unit and the cache memory, said caching method comprising the steps of:
a) upon receipt of a data word to be written into the cache memory, the processing unit
encoding, based on a code rate, the data word into a codeword, which includes a data portion corresponding to the data word, a checksum parity portion associated with a target bit error rate (BER), and an error correction code (ECC) parity portion,
writing the codeword into an area of the cache memory, and
writing the data word into the data storage unit in response to detecting a first condition associated with the area of the cache memory; and
b) upon receipt of a read request for the data word, the processing unit
reading the codeword corresponding to the data word from the cache memory based on the read request,
decoding the read codeword to correct one or more bit errors within the read codeword based on the ECC parity portion thereof so as to generate a sub-codeword that includes a read data portion and a read checksum parity portion,
validating whether the read data portion is free of any bit error,
upon successful validation, outputting the read data portion as the data word, and
upon unsuccessful validation, reading the data word from the data storage unit and outputting the data word thus read from the data storage unit.

2. The caching method as claimed in claim 1, wherein, the first condition indicates that a write count of the area of the cache memory exceeds a predetermined first threshold value.

3. The caching method as claimed in claim 2, wherein the predetermined first threshold value is not greater than 3000.

4. The caching method as claimed in claim 2, wherein, in step b), the processing unit further decreases the code rate in response to detecting a second condition associated with the area of the cache memory.

5. The caching method as claimed in claim 4, wherein the second condition indicates that a ratio of an unsuccessful validation count to a successful validation count exceeds a predetermined second threshold value.

6. The caching method as claimed in claim 5, wherein the predetermined second threshold value is not greater than 0.01.

7. The caching method as claimed in claim 1, wherein the checksum parity portion of the codeword is in the form of a cyclic redundancy check (CRC) code, and has a bit length that is determined based on the target BER.

8. The caching method as claimed in claim 7, wherein the target BER is not greater than $10^{-16}$.

9. The caching method as claimed in claim 1, wherein the ECC parity portion of the codeword is in the form of a Bose Chaudhuri Hocquenghem (BCH) code.

10. The caching method as claimed in claim 1, wherein the ECC parity portion of the codeword is in the form of a Low-Density Parity-Check (LDPC) code.

11. A data storage system comprising:
a data storage unit;
a cache memory; and
a processing unit including
a control module coupled to said data storage unit,
a checksum encoder coupled to said control module,
an error correction code (ECC) encoder coupled to said checksum encoder,
a checksum validation unit coupled to said control module,
an ECC decoder coupled to said checksum validation unit, and
an access unit coupled to said ECC encoder, said ECC decoder, said cache memory and said control module;
wherein, upon receipt of a data word by said control module,
said control module transmits the data word to said checksum encoder, said checksum encoder is operable to encode the data word transmitted from said control module into a sub-codeword, which includes a data portion corresponding to the data word, and a checksum parity portion associated with a target bit error rate (BER), and to transmit the sub-codeword to said ECC encoder, said ECC encoder is operable to encode, based on a code rate, the sub-codeword transmitted from said checksum encoder into a codeword, which includes the sub-codeword and an ECC parity portion, and to transmit the codeword to said access unit, said access unit writes the codeword transmitted from said ECC encoder into an area of said cache memory, and said access unit further writes the data word into said data storage unit in response to detecting a first condition associated with said area of said cache memory; and wherein, upon receipt of a read request for the data word by said control module, said control module generates an access control signal based on the read request, and transmits the access control signal to said access unit, said access unit reads the codeword corresponding to the data word from said cache memory based on the access control signal transmitted from said control module, and transmits the read codeword to said ECC decoder, said ECC decoder is operable to decode the read codeword transmitted from said access unit to correct one or more bit errors within the read codeword based on the ECC parity portion thereof so as to generate a read sub-codeword, which includes a read data portion and a read checksum parity portion, and to transmit the read sub-codeword to said checksum validation unit, said checksum validation unit is operable to validate whether the read sub-codeword transmitted from said ECC decoder is free of any bit error so as to generate a validation result, and to transmit the read data portion of the read sub-codeword and the validation result to said control module, when the validation result indicates successful validation, said control module outputs the read data portion as the data word, and when the validation result indicates unsuccessful validation, said control module reads the data word from said data storage unit and outputs the data word thus read from said data storage unit.

12. The data storage system as claimed in claim 11, wherein the first condition indicates that a write count of said area of said cache memory exceeds a predetermined first threshold value.

13. The data storage system as claimed in claim 12, wherein the predetermined first threshold value is not greater than 3000.

14. The data storage system as claimed in claim 11, wherein:

said control module is further coupled to said ECC encoder and said ECC decoder; and said control module further generates a parity adjustment signal in response to detecting a second condition associated with said area of said cache memory, and outputs the parity adjustment signal to said ECC encoder and said ECC decoder such that said ECC encoder decreases the code rate based on the parity adjustment signal and such that said ECC decoder decodes the read codeword with reference to the parity adjustment signal.

15. The data storage system as claimed in claim 14, wherein the second condition indicates that a ratio of an unsuccessful validation count to a successful validation count exceeds a predetermined second threshold value.

16. The data storage system as claimed in claim 15, wherein the predetermined second threshold value is not greater than 0.01.

17. The data storage system as claimed in claim 11, wherein said checksum encoder is in the form of acyclic redundancy check (CRC) encoder and has a bit length determined based on the target BER.

18. The data storage system as claimed in claim 17, wherein the target BER is not greater than $10^{-16}$.

19. The data storage system as claimed in claim 11, wherein said ECC encoder and said ECC decoder are a Bose Chaudhuri Hocquenghem (BCH) code encoder and a BCH code decoder, respectively, such that the ECC parity portion of the codeword is in the form of a BCH code.

20. The data storage system as claimed in claim 11, wherein said ECC encoder and said ECC decoder are a Low-Density Parity-Check (LDPC) code encoder and an LDPC code decoder, respectively, such that the ECC parity portion of the codeword is in the form of an LDPC code.

* * * * *